(12) United States Patent
Kim et al.

(10) Patent No.: US 11,917,770 B2
(45) Date of Patent: Feb. 27, 2024

(54) DISPLAY APPARATUS

(71) Applicant: SAMSUNG ELECTRONICS CO., LTD., Suwon-si (KR)

(72) Inventors: Yoonah Kim, Suwon-si (KR); Kiwoong Kim, Suwon-si (KR); Dowan Kim, Suwon-si (KR); Chiun Park, Suwon-si (KR); Kwangsung Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/144,592

(22) Filed: May 8, 2023

(65) Prior Publication Data
US 2024/0023253 A1  Jan. 18, 2024

Related U.S. Application Data

(63) Continuation of application No. PCT/KR2023/004736, filed on Apr. 7, 2023.

(30) Foreign Application Priority Data

Jul. 13, 2022 (KR) .................. 10-2022-0086553
Sep. 2, 2022 (KR) .................. 10-2022-0111738

(51) Int. Cl.
*H05K 5/00* (2006.01)
*H01L 25/075* (2006.01)
*H05K 5/02* (2006.01)

(52) U.S. Cl.
CPC ....... *H05K 5/0021* (2013.01); *H01L 25/0753* (2013.01); *H05K 5/0214* (2022.08); *H05K 5/0217* (2013.01)

(58) Field of Classification Search
CPC .. H05K 5/0017; H05K 5/0021; H05K 5/0214; H05K 5/0217
(Continued)

(56) References Cited

U.S. PATENT DOCUMENTS 9,863,586 B2   1/2018  Yang et al.
10,330,979 B2  6/2019  Ryu et al.
(Continued)

FOREIGN PATENT DOCUMENTS

JP  2002-40966 A   2/2002
JP  6832688 B2     2/2021
(Continued)

OTHER PUBLICATIONS

International Search Report (PCT/ISA/210) issued by the International Searching Authority on Jul. 14, 2023 in corresponding International Application No. PCT/KR2023/004736.
(Continued)

*Primary Examiner* — Hung S. Bui
(74) *Attorney, Agent, or Firm* — Sughrue Mion, PLLC

(57) ABSTRACT

A display apparatus includes: a display module including a substrate on which a plurality of light emitting diodes (LEDs) are mounted, a holder covering a rear side of the substrate, a reinforcement member provided on a rear side of the holder, and a fixing member protruding rearward from the holder; a cabinet provided to support the display module and including a plurality of first magnets and a through hole through which the fixing member passes; and a circuit case including a plurality of second magnets and coupled to the cabinet. The display module is coupled to the cabinet by a first magnetic attraction between the plurality of first magnets and the reinforcement member and a second magnetic attraction between the plurality of second magnets and the reinforcement member.

18 Claims, 11 Drawing Sheets

(58) Field of Classification Search
USPC .................. 361/730, 728, 807, 809, 810
See application file for complete search history.

(56) References Cited

U.S. PATENT DOCUMENTS

| | | | |
|---|---|---|---|
| 10,522,519 | B2 | 12/2019 | Ryu et al. |
| 11,122,695 | B2 | 9/2021 | Yi et al. |
| 2018/0031919 | A1* | 2/2018 | Ryu .................. G02F 1/133603 |
| 2019/0239364 | A1* | 8/2019 | Heo .................. H05K 5/03 |
| 2020/0057594 | A1 | 2/2020 | Nakano |
| 2020/0380895 | A1 | 12/2020 | Nakano |
| 2022/0063345 | A1 | 3/2022 | Funase et al. |

FOREIGN PATENT DOCUMENTS

| | | |
|---|---|---|
| JP | 2022-40966 A | 3/2022 |
| KR | 10-0873849 B1 | 12/2008 |
| KR | 10-1149059 B1 | 5/2012 |
| KR | 10-2013-0088683 A | 8/2013 |
| KR | 10-1306188 B1 | 9/2013 |
| KR | 10-2016-0076765 A | 7/2016 |
| KR | 10-1712620 B1 | 3/2017 |
| KR | 10-2017-0115408 A | 10/2017 |
| KR | 10-2009663 B1 | 10/2019 |
| KR | 10-2020-0061604 A | 6/2020 |
| KR | 10-2207491 B1 | 1/2021 |
| KR | 10-2270484 B1 | 6/2021 |
| WO | 2016/065862 A1 | 5/2016 |

OTHER PUBLICATIONS

Written Opinion (PCT/ISA/237) issued by the International Searching Authority on Jul. 14, 2023 in corresponding International Application No. PCT/KR2023/004736.

* cited by examiner

DISPLAY APPARATUS

CROSS-REFERENCE TO RELATED APPLICATIONS

This application is a by-pass continuation application of International Application No. PCT/KR2023/004736, filed on Apr. 7, 2023, which is based on and claims priority to Korean Patent Application Nos. 10-2022-0086553, filed on Jul. 13, 2022, and 10-2022-0111738, filed on Sep. 2, 2022, in the Korean Intellectual Property Office, the disclosures of which are incorporated by reference herein their entireties.

BACKGROUND

1. Field

The disclosure relates to a display apparatus including a plurality of display modules and a cabinet supporting a plurality of display modules.

2. Description of Related Art

A display apparatus is a type of an output device that converts acquired or stored electrical information into visual information and displays the converted information to a user.

A display apparatus may, in order to implement a large-sized screen, include a plurality of display modules and a cabinet supporting the plurality of display modules that are consecutively tiled in an upper-to-lower direction and a left-to-right direction. The cabinet supporting the plurality of display modules may be provided in plural, and the plurality of cabinets may also be provided to be consecutively tiled in an upper-to-lower direction and a left-to-right direction similar to the plurality of display modules. The plurality of display modules supported by the plurality of cabinets may form a single large screen.

SUMMARY

Provided are a display apparatus capable of easily assembling and fixing a display module to a cabinet and a method thereof. Provided are a display apparatus having improved waterproof performance by reducing an area requiring waterproofing in a display module and a method thereof.

According to an aspect of the disclosure, a display apparatus includes: a display module including a substrate on which a plurality of light emitting diodes (LEDs) are mounted, a holder covering a rear side of the substrate, a reinforcement member provided on a rear side of the holder, and a fixing member protruding rearward from the holder; a cabinet provided to support the display module and including a plurality of first magnets and a through hole through which the fixing member passes; and a circuit case including a plurality of second magnets and coupled to the cabinet. The display module is coupled to the cabinet by a first magnetic attraction between the plurality of first magnets and the reinforcement member and a second magnetic attraction between the plurality of second magnets and the reinforcement member.

According to another aspect of the disclosure, a display apparatus includes: a display module comprising a reinforcement member, a first waterproof rib, and a second waterproof rib; and a cabinet comprising a plurality of magnets. The plurality of magnets of the cabinet is magnetically coupled with the reinforcement member of the display module. A first drain hole is provided at a lower end of the first waterproof rib. A second drain hole is provided at a lower end of the second waterproof rib.

According to one aspect of the disclosure, a display apparatus capable of easily assembling and fixing a display module to a cabinet may be provided. According to one aspect of the disclosure, a display apparatus with improved waterproof performance by reducing an area requiring waterproofing in a display module may be provided.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
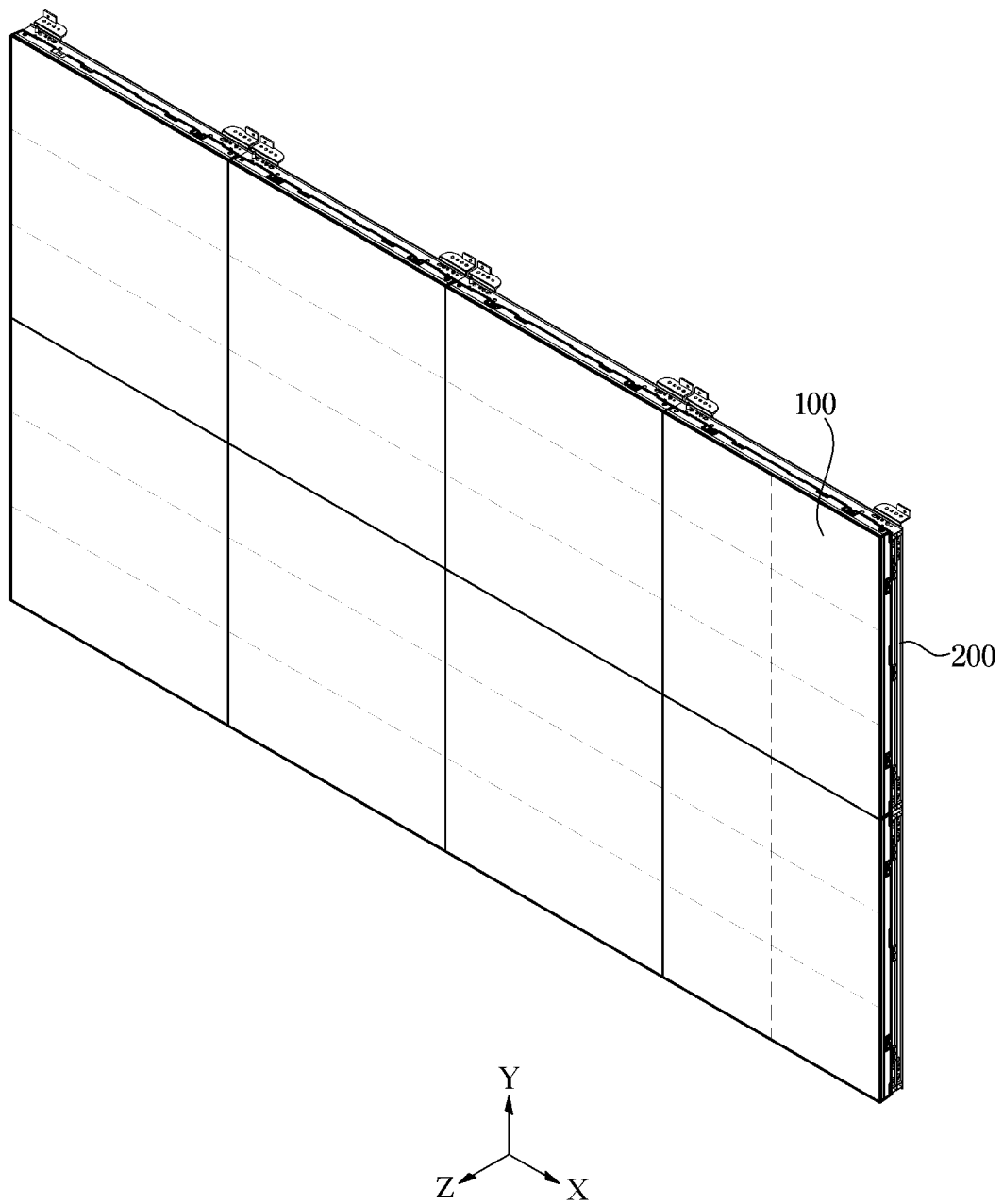
FIG. 1 illustrates a display apparatus according to an embodiment.

Embodiments described in the specification and configurations shown in the accompanying drawings are merely examples of the disclosure, and various modifications may replace the embodiments and the drawings of the disclosure at the time of filing of the application.

Further, identical symbols or numbers in the drawings of the disclosure denote components or elements configured to perform substantially identical functions.

Further, terms used herein are only for the purpose of describing particular embodiments and are not intended to limit to the disclosure. The singular form is intended to include the plural form as well, unless the context clearly indicates otherwise. The terms "include," "including," "have," and/or "having" specify the presence of stated features, integers, steps, operations, elements, components, and/or groups thereof, but do not preclude the presence or addition of one or more other features, integers, steps, operations, elements, components, and/or groups thereof.

Further, although the terms "first," "second," etc. may be used herein to describe various elements, the elements are not restricted by the terms, and the terms are only used to distinguish one element from another. For example, a first element could be termed a second element, and similarly, a second element could be termed a first element without departing from the scope of the disclosure. The term "and/or" includes combinations of one or all of a plurality of associated listed items. The terms "front", "rear", "left", "right", and the like as herein used are defined with respect to the drawings, but the terms may not restrict the shape and position of the respective components.

A display apparatus according to an embodiment may include: a display module including a substrate on which a plurality of light emitting diodes (LEDs) are mounted, a holder covering a rear side of the substrate, a reinforcement member provided on a rear side of the holder, and a fixing member protruding rearward from the holder; a cabinet provided to support the display module and including a plurality of first magnets and a through hole through which the fixing member (e.g., selectively) passes; and a circuit case including a plurality of second magnets and coupled to the cabinet, wherein the display module is coupled to the cabinet by magnetic attraction between the plurality of first magnets and the reinforcement member and magnetic attraction between the plurality of second magnets and the reinforcement member.

The fixing member may be provided to be rotatable between a disengagement position in which the fixing member may be allowed to pass through the through hole and an engagement position in which the fixing member may be prevented from passing through the through hole.

The fixing member may be configured to, when positioned in the engagement position, prevent the display module from being separated from the cabinet.

The fixing member may be configured to, when positioned in the disengagement position, allow the display module to be separated from the cabinet.

One end of the fixing member may be exposed on a front side of the display module such that the fixing member may be rotatable at a front of the display module.

The other end of the fixing member may be exposed on a rear side of the display module such that the fixing member may be rotatable at a rear of the display module.

The display module may further include a ground gasket mounted on the substrate to be in contact with a ground pad of the substrate.

At least a portion of the ground gasket may be provided to be in contact with the reinforcement member through a ground hole formed in the holder.

The display module may further include a ground sealing member provided between the holder and the reinforcement member to seal a periphery of the ground hole. In one embodiment, the ground sealing member extends along a periphery of the ground hole.

The display module may further include a first connector exposed on a rear side of the display module through a first connector hole formed in the holder.

The circuit case may further include a second connector exposed on a front side of the circuit case through a second connector hole formed in the circuit case. The second connector may be coupled to the first connector.

The holder may further include: a first waterproof rib provided to surround the first connector hole to prevent water from flowing into the first connector hole from outside of the first connector hole, and a second waterproof rib provided inside of the first waterproof rib to surround the first connector hole.

The holder may be provided to block water from being introduced to a region inside the holder from a region of the holder other than the first connector hole.

The first waterproof rib may include a first drain hole provided at a lower end of the first waterproof rib to discharge water inside of the first waterproof rib downward.

The second waterproof rib may include a second drain hole provided at a lower end of the second waterproof rib to discharge water inside of the second waterproof rib downward.

The second drain hole may be arranged to be spaced apart from the first drain hole in an upper-to-lower direction and in a left-to-right direction to reduce an amount of water from a lower side of the first waterproof rib and passing through the first drain hole and the second drain hole The display module may further include a sealing member provided inside of the second waterproof rib to seal a region between the second waterproof rib and the first connector hole.

The sealing member may be coupled to the holder or the circuit case.

The holder may further include: a third waterproof rib provided inside of the second waterproof rib to surround the first connector hole; and a sealing groove formed between the second waterproof rib and the third waterproof rib.

The sealing member may be inserted into the sealing groove.

The display module may include a plurality of display modules.

The cabinet may be provided to support the plurality of display modules.

The cabinet may include a plurality of cabinets.

The plurality of cabinets may be provided to be coupled to each other in a horizontal direction and a vertical direction.

Hereinafter, embodiments according to the disclosure will be described in detail with reference to the accompanying drawings.

Figure 2:
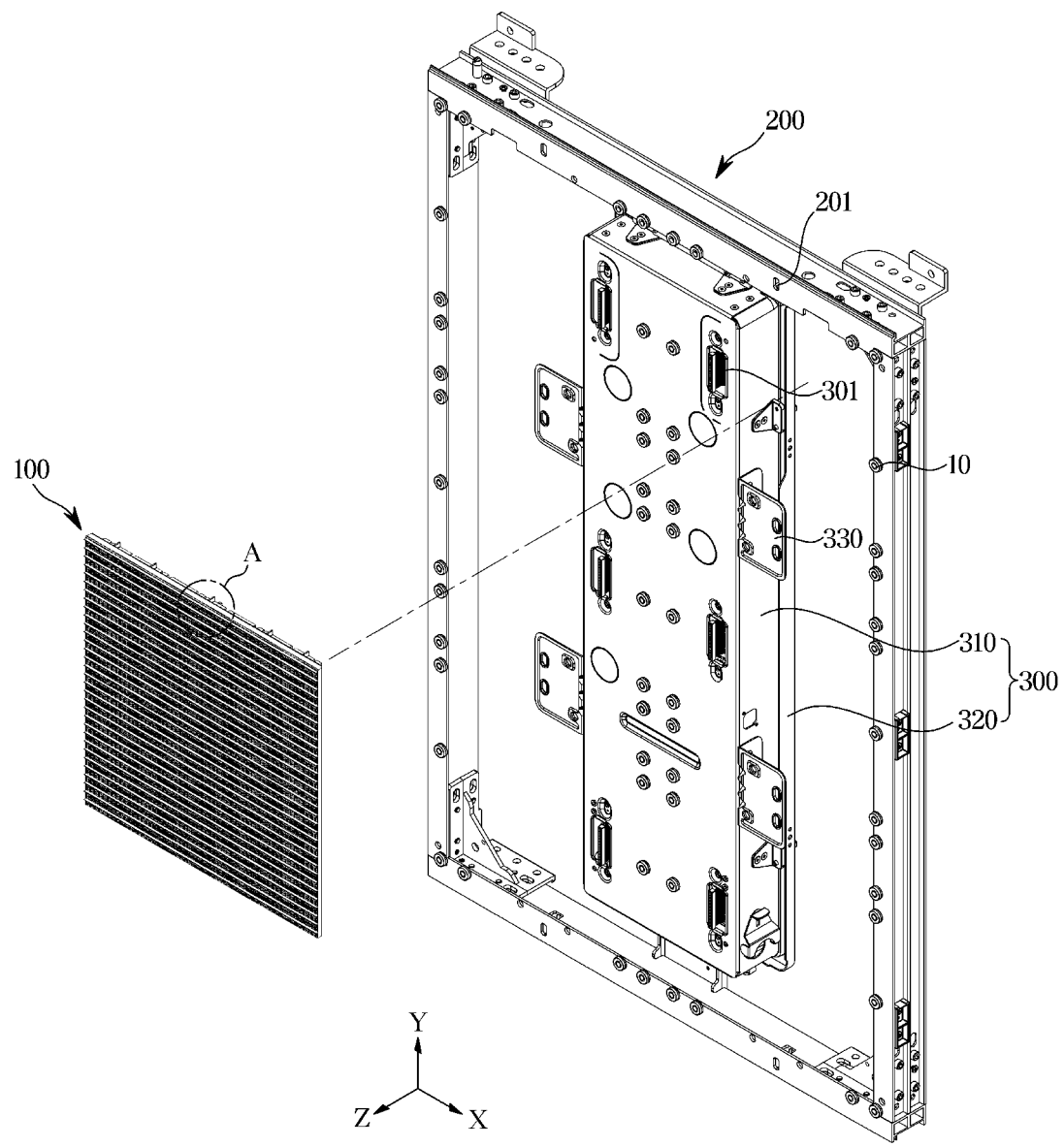
FIG. 2 illustrates a cabinet and a display module separated from the cabinet in a display apparatus according to an embodiment, when viewed from the front.

FIG. 1 illustrates a display apparatus according to an embodiment. FIG. 2 illustrates a cabinet and a display module separated from the cabinet in a display apparatus according to an embodiment, which is viewed from the front.

In FIG. 1, the X-axis, the Y-axis, and the Z-axis directions perpendicular to each other are shown, in which the X-axis direction refers to a left-to-right direction, the Y-axis direction refers to an upper-to-lower direction, and the Z-axis direction refers to a front to rear direction.

The following description is made with reference to FIGS. 1 and 2. A display apparatus 1 displays information, materials, data, and the like in the form of characters, figures, graphs, images, and the like, and may be implemented as a billboard, an electric sign board, a screen, a television, a monitor, and the like. The display apparatus 1 may be installed on a wall or ceiling, or installed on an indoor or outdoor ground by a stand.

The display apparatus 1 may include a display module 100 displaying a screen, a cabinet 200 coupled to a rear side of the display module 100 to support the display module 100, and a circuit case 300 coupled to the cabinet 200 and accommodating electronic components therein.

In the display apparatus 1 according to an embodiment, six display modules 100 may be coupled to one cabinet 200. For example, two of the display modules 100 may be coupled to the one cabinet 200 in a left-to-right (X) direction, and three of the display modules 100 may be coupled to the one cabinet 200 in an upper-to-lower (Y) direction. That is, the display modules 100 may be coupled to the cabinet 200 in a 2×3 matrix form. However, the number of display modules 100 coupled to the cabinet 200 is not limited. Two or more display modules 100 may be coupled to one cabinet 200.

Referring to FIG. 1, the display apparatus 1 according to the embodiment may include eight (8) cabinets 200 and forty eight (48) display modules 100 coupled to the eight (8) cabinets 200. As described above, the display apparatus 1 may implement a large sized screen by consecutively arranging a plurality of cabinets 200, to which a plurality of display modules 100 are coupled, in the left-to-right (X) direction and the upper-to-lower (Y) direction. The number of cabinets 200 consecutively arranged in the left-to-right (X) direction and in the upper-to-lower (Y) direction is not limited, and as described above, the number of the plurality of display modules 100 coupled to the cabinet 200 is not limited.

Referring to FIG. 2, the display module 100 may be separably coupled to the cabinet 200. The display module 100 may be separated from the cabinet 200 forward of the cabinet 200. The display module 100 may be coupled to the cabinet 200 by a magnetic force. The cabinet 200 and the circuit case 300 may include a plurality of magnets 10 provided on front surfaces thereof. The plurality of magnets 10 may include a plurality of first magnets provided on the front surface of the cabinet 200. The plurality of magnets 10 may also include a plurality of second magnets provided on the front surface of the circuit case 300. The display module 100 may include a reinforcement member 140 (see FIG. 5) provided on a rear surface thereof and coupled to the plurality of first magnets and the plurality of second magnets by magnetic attraction. The plurality of first magnets provided on the cabinet 200 and the plurality of second magnets provided on the circuit case 300 may be the same components. The plurality of first magnets and the plurality of second magnets may be collectively referred to as the plurality of magnets 10.

Figure 5:
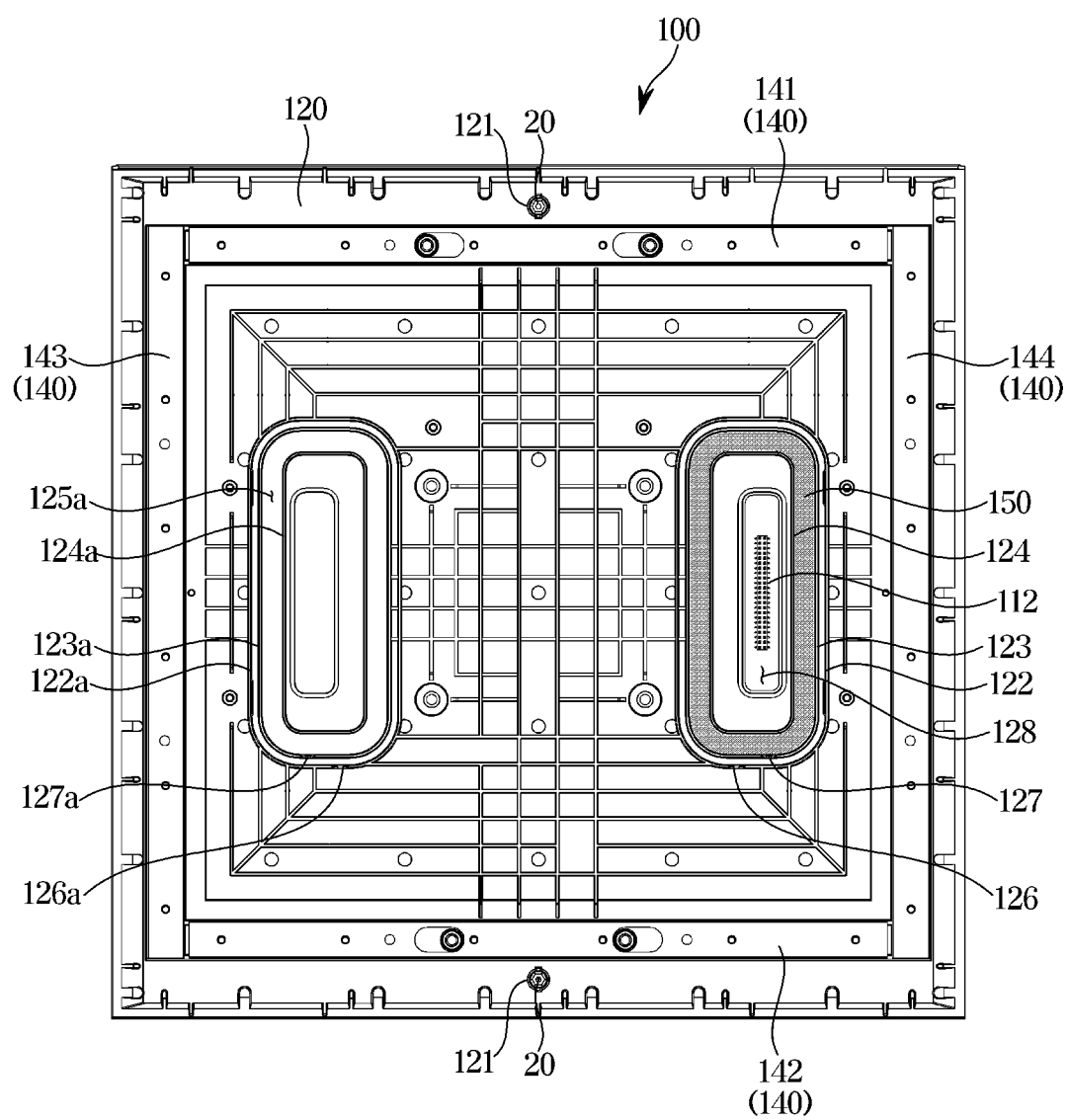
FIG. 5 illustrates a display module in a display apparatus according to an embodiment.
Figure 6:
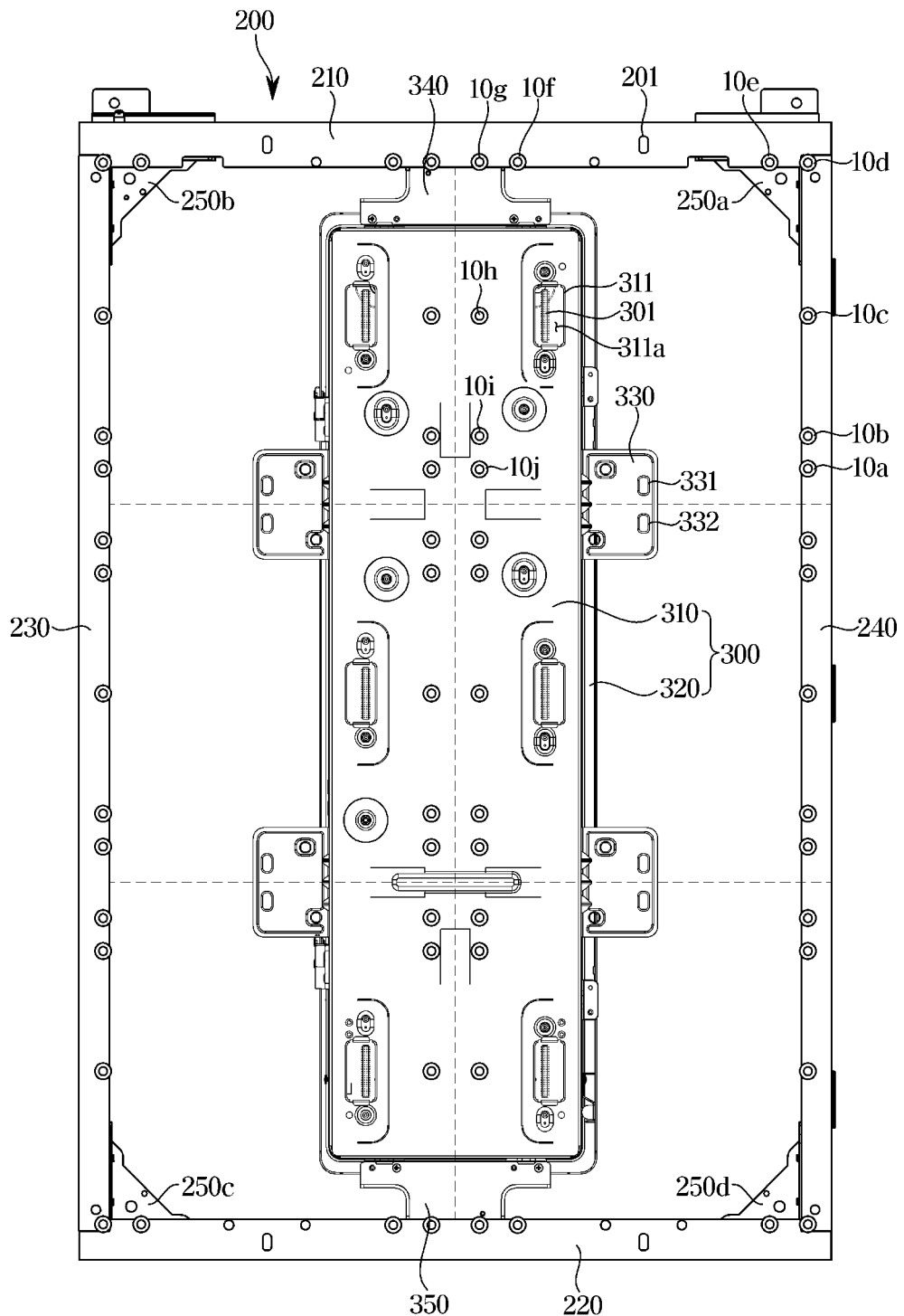
FIG. 6 illustrates a front view of a cabinet in a display apparatus according to an embodiment.

As shown in FIG. 6, the cabinet 200 may include frames (a first frame 210, a second frame 220, a third frame 230, and a fourth frame 240) forming an outer edge of the cabinet 200. The circuit case 300 may be disposed inside of the first frame 210, the second frame 220, the third frame 230, and the fourth frame 240. The circuit case 300 may include a second connector 301 corresponding to a first connector 112 (see FIG. 5) included in each of the plurality of display modules 100. The circuit case 300 may include a first case 310 having a hexahedral shape with one open surface and a second case 320 provided to cover the open surface of the first case 310.

As the first connectors 112 of the plurality of display modules 100 are coupled to the second connectors 301 of the circuit case 300, the plurality of display modules 100 may be electrically connected to each other. In addition, the plurality of display modules 100 may be supplied with power from a power supply device disposed inside the circuit case 300.

Figure 3:
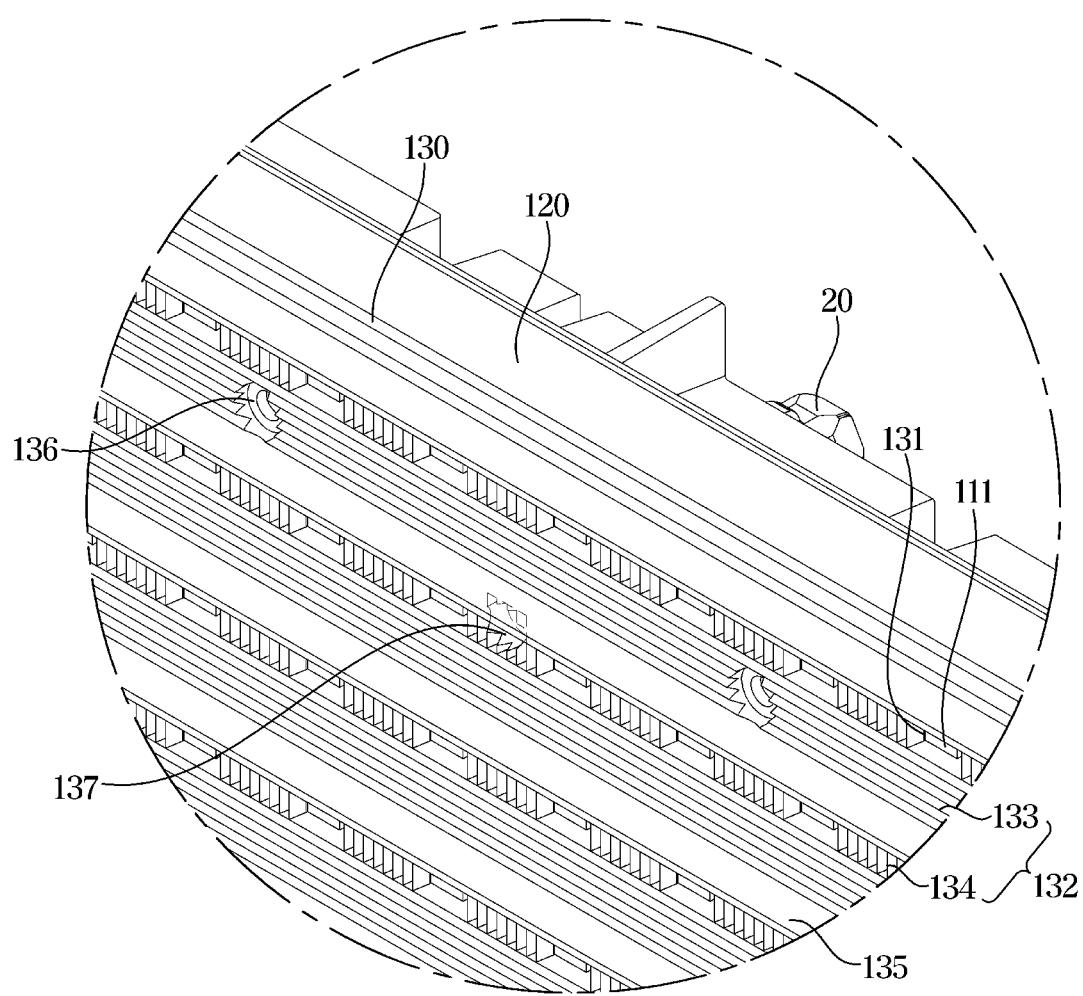
FIG. 3 illustrates an enlarged view of part A of FIG. 2.

FIG. 3 is an enlarged view of part A of FIG. 2.

Referring to FIG. 3, the display module 100 may include a substrate 110 (see FIG. 11) and a holder 120 covering side and rear surfaces of the substrate 110 and supporting the substrate 110. The substrate 110 may be attached to a front surface of the holder 120 through an adhesive, a double-sided adhesive tape, or the like, or coupled to the holder 120 through a fastening member, such as a screw.

A plurality of LEDs 111 may be mounted on the front surface of the substrate 110. The substrate 110 may be formed of a material, such as glass, polyimide (PI), or FR4. The plurality of LEDs 111 may include a red LED, a green LED, and a blue LED as one pixel in a package. The plurality of LEDs 111 may be mounted on the substrate 110 in a matrix form. The plurality of LEDs 111 may be arranged to have regular intervals, and intervals between the plurality of LEDs 111 may be variously determined according to the resolution and size of the display apparatus 1.

The display module 100 may include a cover plate 130 provided to cover the front surface of the substrate 110. The cover plate 130 may include a plurality of LED holes 131 respectively corresponding to the plurality of LEDs 111 mounted on the substrate 110. The plurality of LEDs 111 may be exposed on the front surface of the cover plate 130 through the plurality of LED holes 131.

The substrate 110 may be accommodated inside of the cover plate 130 and the holder 120. The cover plate 130 and the holder 120 may be coupled to each other to form an inner space accommodating the substrate 110 therein.

The cover plate 130 may include a louver portion 132. The louver portion 132 may include a horizontal louver portion 133 and a vertical louver portion 134. The louver portion 132 may reduce or block moisture flowing into the plurality of LEDs 111. In addition, the cover plate 130 may include a loop portion 135 provided on upper sides of the plurality of LEDs 111. The loop portion 135 may protrude forward of the cover plate 130 to prevent water from being directly introduced into the plurality of LEDs 111 from above.

The cover plate 130 may include a fastening hole 136 into which a fastening member for coupling the cover plate 130, the substrate 110, and the holder 120 is inserted, and a fixing hole 137 into which the fixing member 20 is inserted.

Figure 4:
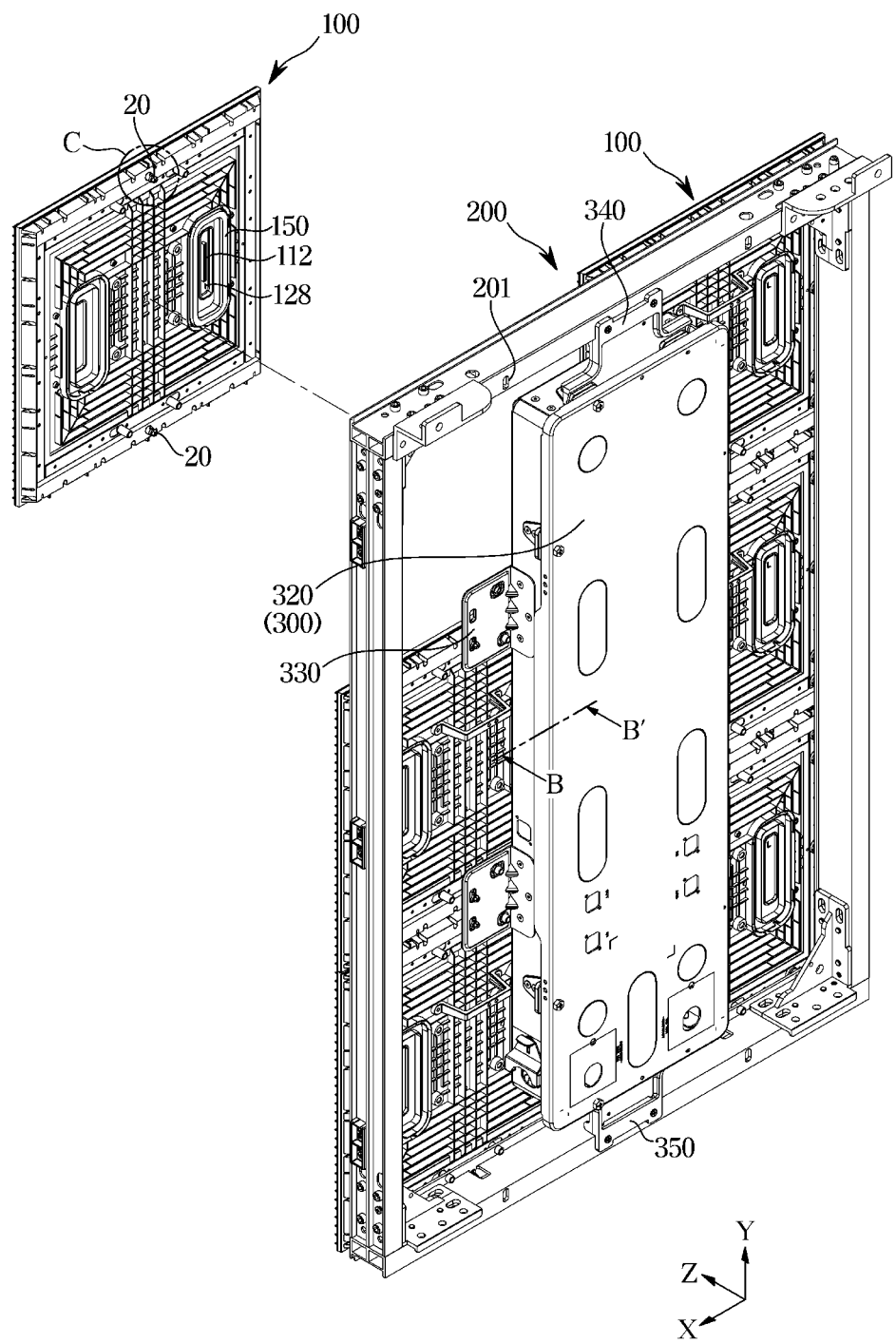
FIG. 4 illustrates a cabinet and a display module separated from the cabinet in a display apparatus according to an embodiment, when viewed from the rear.

FIG. 4 illustrates a cabinet and a display module separated from the cabinet in a display apparatus according to an embodiment, which is viewed from the rear. FIG. 5 is a rear view illustrating a display module in a display apparatus according to an embodiment.

Referring to FIG. 4, the display module 100 may be separated forward of the cabinet 200. As described above, the display module 100 may be coupled to the cabinet 200 by a magnetic force. A plurality of magnets 10 (see FIG. 2) may be provided on the front surface of the cabinet 200, and a reinforcement member 140 (see FIG. 5), which is attracted by magnetic attraction of the plurality of magnets 10, may be provided on the rear surface of the display module 100.

Referring to FIG. 5, the reinforcement member 140 may be coupled to the rear surface of the holder 120. The reinforcement member 140 may be disposed on an edge of the rear surface of the holder 120. The reinforcement member 140 may include a first reinforcement member 141, a second reinforcement member 142, a third reinforcement member 143, and a fourth reinforcement member 144.

The first reinforcement member 141 may be provided adjacent to an upper edge of the rear surface of the holder 120 and may extend in the horizontal direction. The second reinforcement member 142 may be provided adjacent to a lower edge of the rear surface of the holder 120 and may extend in the horizontal direction. The third reinforcement member 143 may be provided adjacent to a left edge of the rear surface of the holder 120 and may extend in the vertical direction. The fourth reinforcement member 144 may be provided adjacent to a right edge of the rear surface of the holder 120 and may extend in the vertical direction.

The reinforcement member 140 may provide various advantages. For example, the reinforcement member 140 may be coupled to the rear surface of the holder 120 to reinforce the strength of the display module 100. The reinforcement member 140 may prevent the display module 100 from bending. The reinforcement member 140 may prevent physical deformation of the display module 100.

The reinforcement member 140 may be formed of a material attracted by the magnetic force of the magnet 10.

The reinforcement member 140 may be formed of a material that is magnetizable by an external magnetic force. The reinforcement member 140 and the magnet 10 may be attracted to each other by a polarity of the reinforcement member 140 obtained from the external magnetic force. The reinforcement member 140 may include a magnetic material that interacts with the magnet 10. The reinforcement member 140 may include iron (Fe).

As shown in FIG. 5, the display module 100 may include a fixing member 20 that may be respectively provided on the upper side and the lower side of the rear surface of the display module 100. According to one embodiment, the fixing members 20 may be provided at the upper center region of the rear surface and the lower center region of the rear surface of the display module 100, but the positions thereof are not limited.

The fixing member 20 may prevent the display module 100 from being separated from the cabinet 200. The display module 100 may be coupled by a magnetic attraction between the plurality of magnets 10 and the reinforcement member 140, but in response to application of a force greater than the magnetic attraction to separate the display module 100 from the cabinet 200, the display module 100 may be separated from the cabinet 200. In order to prevent the separation, the fixing member 20 may be provided to prevent the display module 100 from moving forward of the cabinet 200.

The display module 100 may include a first connector hole 128 that allows the first connector 112 provided on the rear surface of the substrate 110 to be exposed on the rear surface of the display module 100. The display module 100 may include a first waterproof rib 122, a second waterproof rib 123, and a third waterproof rib 124 protruding rearward from the rear surface of the holder 120 to block water from being introduced into the first connector hole 128. A sealing groove (the sealing groove 125, see FIG. 7) may be formed between the second waterproof rib 123 and the third waterproof rib 124, and a sealing member 150 may be provided in the sealing groove 125.

According to an embodiment, the first waterproof rib 122, the second waterproof rib 123, and the third waterproof rib 124 may each be provided in a ring shape. The second waterproof rib 123 may be provided inside of the first waterproof rib 122, and the third waterproof rib 124 may be provided inside of the second waterproof rib 123.

According to an embodiment, the first waterproof rib 122, the second waterproof rib 123, and the third waterproof rib 124 may be provided to be in contact with the front surface of the circuit case 300 to prevent moisture from being introduced from the outer side to the inside of the first waterproof rib 122, the second waterproof rib 123, and the third waterproof rib 124.

According to an embodiment, the sealing member 150 may be provided in the sealing groove 125 formed between the second waterproof rib 123 and the third waterproof rib 124. The sealing member 150 may be provided to correspond to the shape of the sealing groove 125. The sealing member 150 may be provided in a substantially ring shape. The sealing member 150 may be formed of a material capable of changing in volume, and may include, for example, rubber.

According to an embodiment, the sealing member 150 may be attached to the rear surface of the display module 100, but is not limited thereto. The sealing member 150 may be attached to the front surface of the circuit case 300 to correspond to the sealing groove 125.

As shown in FIG. 5, the display module 100 may include a first waterproof rib 122a, a second waterproof rib 123a, a third waterproof rib 124a, and a sealing groove 125a bilaterally symmetrical to the first waterproof rib 122, the second waterproof rib 123, the third waterproof rib 124, and the sealing groove 125. The first waterproof rib 122a, the second waterproof rib 123a, and the third waterproof rib 124a may be referred to as left side waterproof ribs, and the first waterproof rib 122, the second waterproof rib 123, and the third waterproof rib 124 may be referred to as right side waterproof ribs.

The left side waterproof ribs (the first waterproof rib 122a, the second waterproof rib 123a, and the third waterproof rib 124a) may have the same structures bilaterally symmetrical to those of the right side waterproof ribs (the first waterproof rib 122, the second waterproof rib 123, and the third waterproof rib 124). This is to allow the display modules 100 to be coupled to both a left column and a right column between two columns of the cabinet 200.

For example, when the display module 100 is coupled to the right column of the cabinet 200, the first connector 112 may be disposed inside of the right side waterproof ribs (the first waterproof rib 122, the second waterproof rib 123, and the third waterproof rib 124), and the sealing member 150 may be provided in the right side sealing groove (the sealing groove 125) to prevent water from being introduced into the first connector 112.

Conversely, when the display module 100 is coupled to the left column of the cabinet 200, the first connector 112 may be disposed inside of the left side waterproof ribs (the first waterproof rib 122a, the second waterproof rib 123a, and the third waterproof rib 124a), and the sealing member 150 may be provided in the left side sealing groove (the sealing groove 125a). In addition, the first connector hole may not be provided inside of a waterproof rib in which the first connector 112 is not disposed. Referring to FIG. 5, a first connector hole may not be provided inside of the left side waterproof rib (the third waterproof rib 124a), and a first connector hole 128 may be provided inside of the right side waterproof rib (the third waterproof rib 124) to allow the first connector 112 to be exposed there through.

In the following description, the right side waterproof ribs (the first waterproof rib 122, the second waterproof rib 123, and the third waterproof rib 124) and the right side sealing groove (the sealing groove 125) will be referred to as waterproof ribs (the first waterproof rib 122, the second waterproof rib 123, and the third waterproof rib 124) and a sealing groove 125.

FIG. 6 is a front view illustrating a cabinet in a display apparatus according to an embodiment.

The cabinet 200 may be formed by coupling four frames (the first frame 210, the second frame 220, the third frame 230, and the fourth frame 240) each extending in one direction. The four frames (the first frame 210, the second frame 220, the third frame 230, and the fourth frame 240) may be coupled to each other by a first corner bracket 250a, a second corner bracket 250b, a third corner bracket 250c, and a fourth corner bracket 250d.

Specifically, the frames (the first frame 210, the second frame 220, the third frame 230, and the fourth frame 240) may include a first frame 210 forming an upper edge of the cabinet 200, a second frame 220 forming a lower edge of the cabinet 200, a third frame 230 forming a left edge of the cabinet 200, and a fourth frame 240 forming a right edge of the cabinet 200. The first frame 210 and the second frame 220 may be disposed in the horizontal direction, and the third frame 230 and the fourth frame 240 may be disposed in the vertical direction.

The first frame 210 and the fourth frame 240 may be coupled to each other by a first corner bracket 250a. The first frame 210 and the third frame 230 may be coupled to each other by a second corner bracket 250b. The second frame 220 and the third frame 230 may be coupled to each other by a third corner bracket 250c, and the second frame 220 and the fourth frame 240 may be coupled to each other by a fourth corner bracket 250d.

The first frame 210, the second frame 220, the third frame 230, and the fourth frame 240 may be coupled to each other by the first corner bracket 250a, the second corner bracket 250b, the third corner bracket 250c, and the fourth corner bracket 250d to have a rectangular frame shape.

The circuit case 300 may be located at the central region inside of the frames (the first frame 210, the second frame 220, the third frame 230, and the fourth frame 240). The circuit case 300 may be coupled to the frames (the first frame 210 and the second frame 220) by a first connection bracket 340 and a second connection bracket 350 respectively provided on the upper side and the lower side of the circuit case 300.

The circuit case 300 may include a first case 310 forming front and side surfaces of the circuit case 300 and having a rear surface thereof open, and a second case 320 provided to cover the open rear surface of the first case 310. The first case 310 and the second case 320 may be coupled to each other to form the circuit case 300. The first case 310 and the second case 320 may be coupled to each other so that an inside of the first case 310 and the second case 320 may be sealed. The first case 310 and the second case 320 may be coupled to each other to block inflow of water from the outside.

The first case 310 may have a second connector hole 311a formed through the front surface thereof. The first case 310 may include a rib 311 provided along the circumference of the second connector hole 311a and protruding forward. A second connector 301 may be disposed inside of the second connector hole 311a.

The second connector hole 311a, the second connector 301, and the rib 311 may be provided to be corresponding to the number of display modules 100 coupled to the cabinet 200.

Inside the circuit case 300, a power supply device may be provided to supply power to the display module 100, a control board provided to control the display module 100, and the like. In one embodiment, electronic parts may include the power supply device and the control board described above.

The circuit case 300 may include a support bracket 330 to support the display module 100. The support brackets 330 may be coupled to both sides of the circuit case 300. In addition, the support brackets 330 may be provided above and below each other, on both sides of the circuit case 300. According to an embodiment, four support brackets 330 may be coupled to the circuit case 300.

The cabinet 200 may include a plurality of magnets 10. In addition, the circuit case 300 may include a plurality of magnets 10. Specifically, the cabinet 200 may include a plurality of magnets 10 disposed spaced apart from each other on the front surfaces of the first frame 210, the second frame 220, the third frame 230, and the fourth frame 240. In addition, the circuit case 300 may include a plurality of magnets 10 disposed spaced apart from each other on the front surface of the circuit case 300.

Referring to FIG. 6, the cabinet 200 and the circuit case 300 according to the embodiment may include ten magnets 10 for each of the display module 100. The cabinet 200 and the circuit case 300 may include a total of sixty (60) magnets 10. The cabinet 200 may include thirty eight (38) magnets 10, and the circuit case 300 may include twenty two (22) magnets 10. However, the number and position of the magnets 10 are not limited thereto, and the number and position of the magnets 10 may be changed.

For example, in order to support the display module 100 coupled to the upper right side of the cabinet 200, the cabinet 200 may include the first to seventh magnets 10a, 10b, 10d, 10e, 10f, and 10g, and the circuit case 300 may include the eighth to tenth magnets 10i, and 10j.

As described above, the plurality of magnets 10 may attract the reinforcement member 140, which is formed of a magnetizable material and disposed on the rear surface of the display module 100, by magnetic attraction, so that the display module 100 may be coupled to the cabinet 200.

Figure 7:
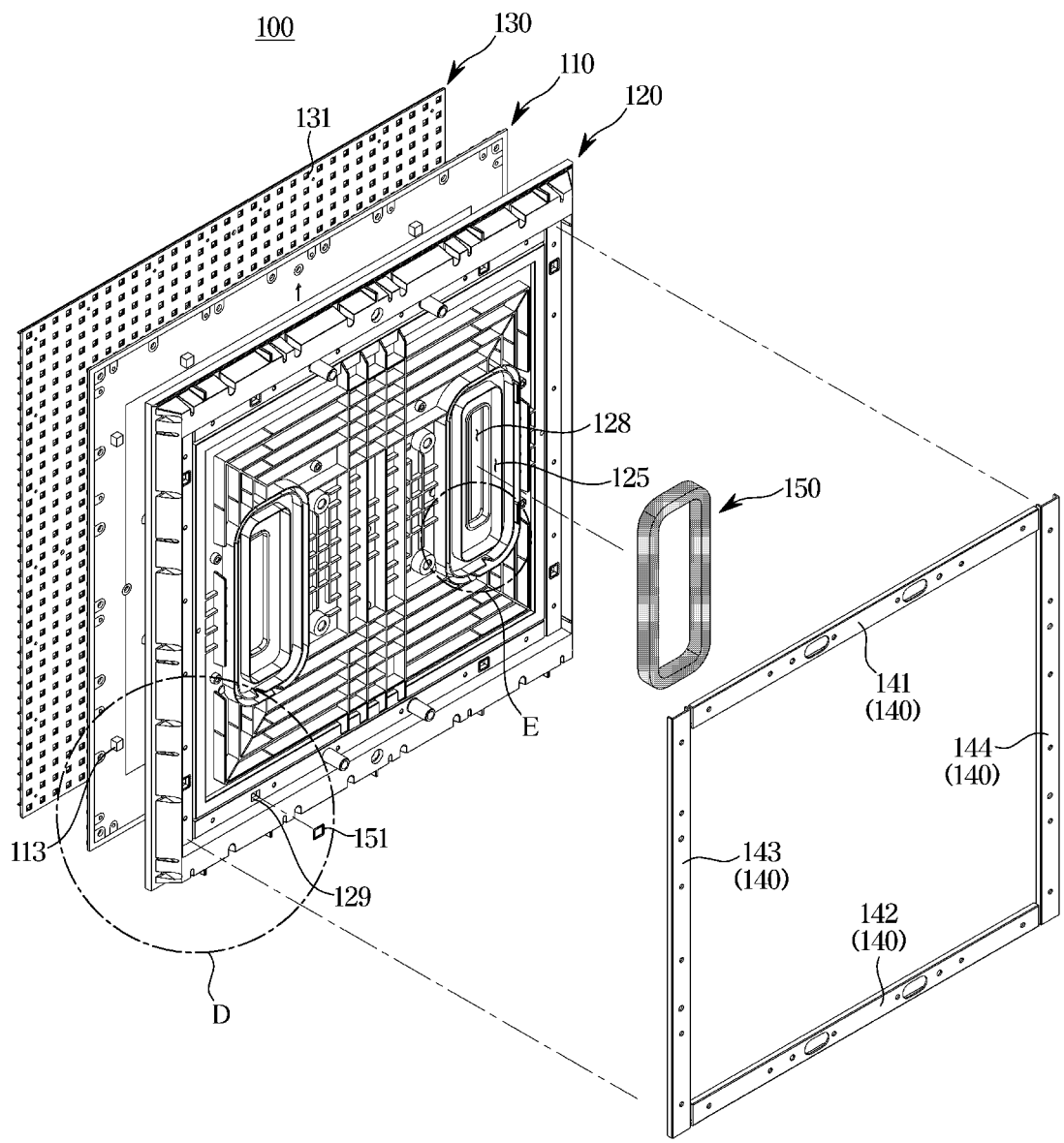
FIG. 7 illustrates an exploded perspective view of a display module in a display apparatus according to an embodiment.
Figure 8:
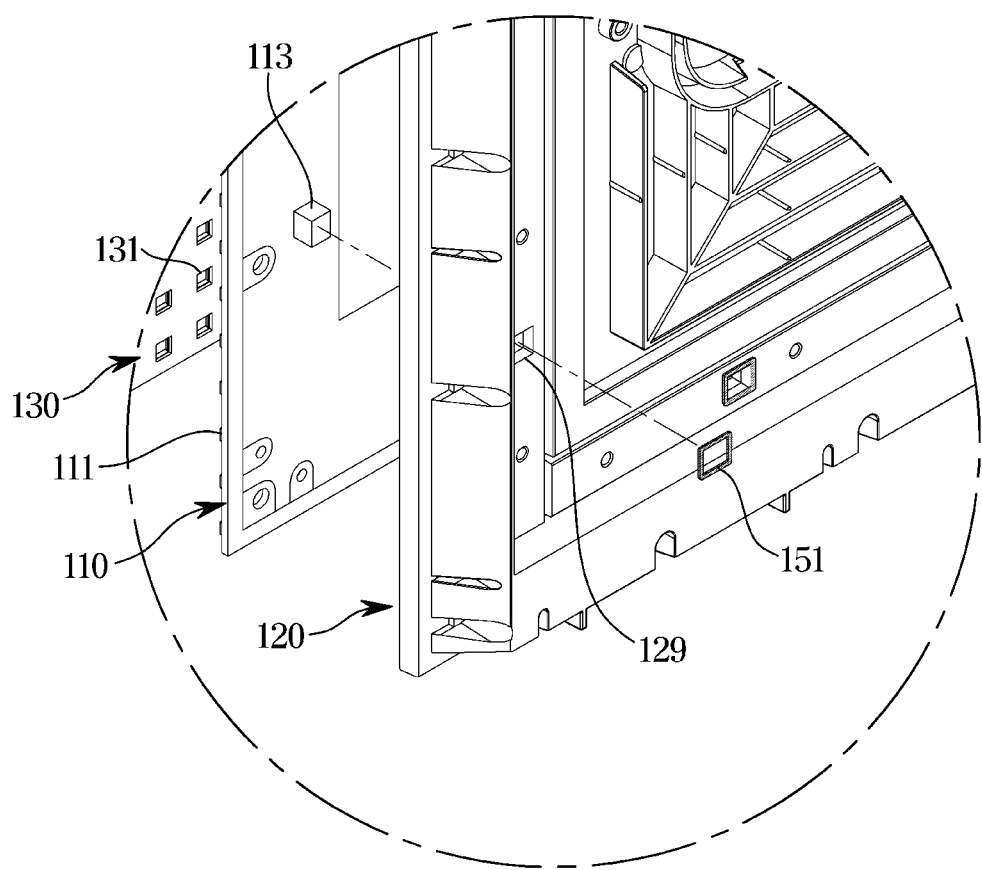
FIG. 8 illustrates an enlarged view of part D of FIG. 7.

FIG. 7 is an exploded perspective view illustrating a display module in a display apparatus according to an embodiment. FIG. 8 is an enlarged view of part D of FIG. 7.

Referring to FIGS. 7 and 8, a ground gasket 113, which is in contact with a ground pad of the substrate 110, may be provided on the rear surface of the substrate 110. The ground gasket 113 may be mounted on the substrate 110. The ground gasket 113 may be formed of a material having excellent electrical conductivity. The holder 120 may include a ground hole 129 through which at least a portion of the ground gasket 113 passes. The ground hole 129 may be provided in a size corresponding to the ground gasket 113 at a position corresponding to the ground gasket 113.

The display module 100 may include a ground sealing member 151 surrounding the ground hole 129. The ground sealing member 151 may seal the periphery of the ground hole 129. That is, the ground sealing member 151 may extend along the periphery of the ground hole 129. The ground sealing member 151 may be placed between the rear surface of the holder 120 and the reinforcement member 140. The ground sealing member 151 may seal a region between the holder 120 and the reinforcement member 140 to block water inflow into the ground hole 129. The ground sealing member 151 may have a closed loop shape to block water inflow into the ground hole 129 in all directions, of an upper-to-lower direction and a left-to-right direction.

The reinforcement member 140 may be in contact with at least a portion of the ground gasket 113 protruding rearward of the holder 120 by passing through the ground hole 129. The reinforcement member 140 may be in contact the ground gasket 113 and the magnet of the cabinet 200. The reinforcement member 140 may be formed of a material having excellent electrical conductivity. The reinforcement member 140 may, upon occurrence of a surge in the substrate 110, allow overcurrent to flow from the ground gasket 113 to the magnet and then to the cabinet 200. The overcurrent due to the surge may flow from the reinforcement member 140 in contact with the ground gasket 113, to the magnet 10 in contact with the reinforcement member 140, and then to the cabinet 200. Through this, components, such as the plurality of LEDs 111 mounted on the substrate 110, may be prevented from being damaged or destroyed due to a surge. The reinforcement member 140 may serve as a ground plane in a broad sense.

Figure 9:
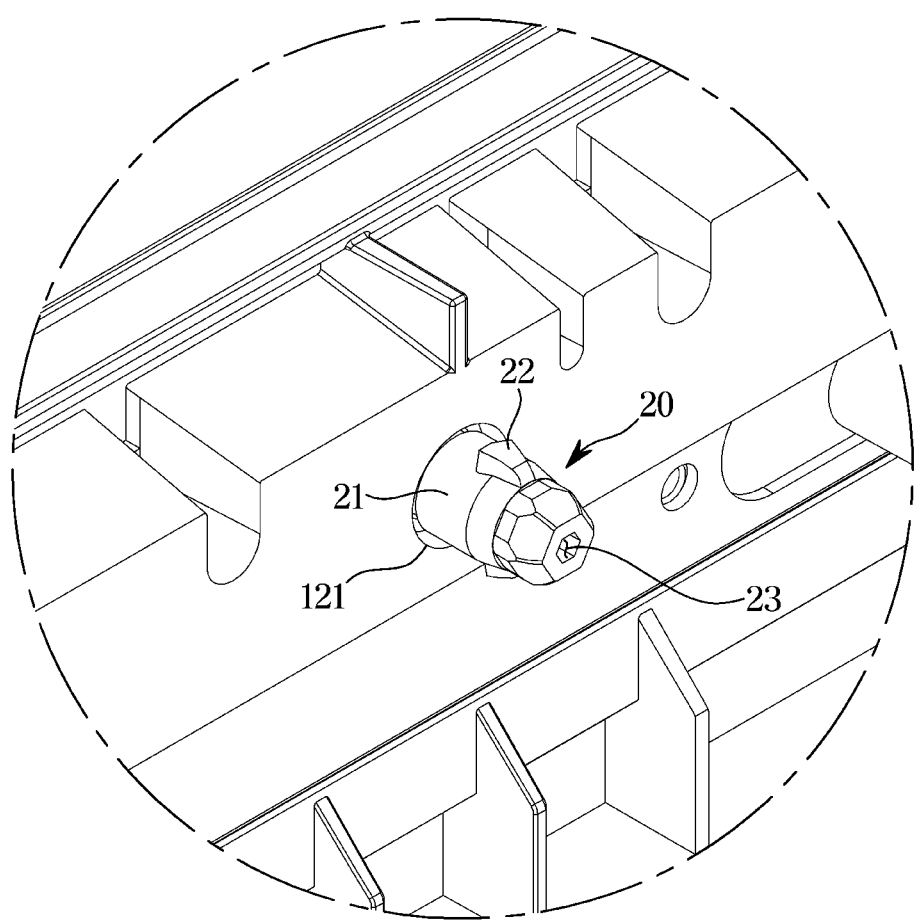
FIG. 9 illustrates an enlarged view of part C of FIG. 4.

FIG. 9 is an enlarged view of part C of FIG. 4.

According to an embodiment, the fixing member 20 (shown in FIG. 4 and FIG. may be provided in the form of a wing nut. Specifically, the fixing member 20 may include a body portion 21 having a cylindrical shape and inserted into a holder hole 121 of the holder 120 and a protrusion portion 22 protruding outward of the body portion 21. The protrusion portions 22 may be provided as a pair.

The cabinet 200 may include a through hole 201 through which the fixing member 20 may pass. The fixing member 20 may be rotatable between a disengagement position in which the fixing member 20 is allowed to pass through the through hole 201 and an engagement position in which the fixing member 20 is prevented from passing through the through hole 201 by the protrusion portion 22 being caught in the through hole 201.

The user may rotate the fixing member 20, which protrudes rearward of the cabinet 200 through the through hole 201, at the rear of the cabinet 200 by hands without a separate tool, thereby engaging the display module 100 with the cabinet 200, or disengaging the display module 100 from the cabinet 200. When the fixing member 20 passed through the through hole 201 is in the disengagement position and a force greater than or equal to magnetic force is applied to the display module 100, the display module 100 may be separated from the cabinet 200. When the fixing member 20 passed through the through hole 201 is in the engagement position, the display module 100 may be prevented from being separated from the cabinet 200.

The display module 100 may include a fixing hole 137 (see FIG. 3) through which at least a portion of the fixing member 20 is exposed on the front surface of the display module 100. The fixing hole 137 may be formed by passing through the display module 100. One end of the fixing member 20 may be exposed on the front surface of the display module 100 through the fixing hole 137. The one end of the fixing member 20 may include a groove having a predetermined shape. For example, the one end of the fixing member 20 may include the same hexagonal groove 23 as that provided at the other end of the fixing member 20.

A user may rotate the fixing member 20 at the front of the display module 100 using a tool having a shape corresponding to the groove formed in the one end of the fixing member 20. As described above, the display module 100 may become separable from the cabinet 200 by rotating the fixing member 20. Through this, the display module 100 may be separated from the cabinet 200 even at the front of the display module 100 without approaching the rear surface of the cabinet 200.

As described above, the display module 100 may be coupled to the cabinet 200 by the magnetic attraction between the magnet 10 and the reinforcement member 140. In order to prevent the display module 100 from being separated from the cabinet 200 in response to application of an external force greater than or equal to the magnetic attraction, the display module 100 may include the fixing member 20. When the fixing member 20 is positioned at the engagement position, the display module 100 may be prevented from being separated from the cabinet 200.

Figure 10:
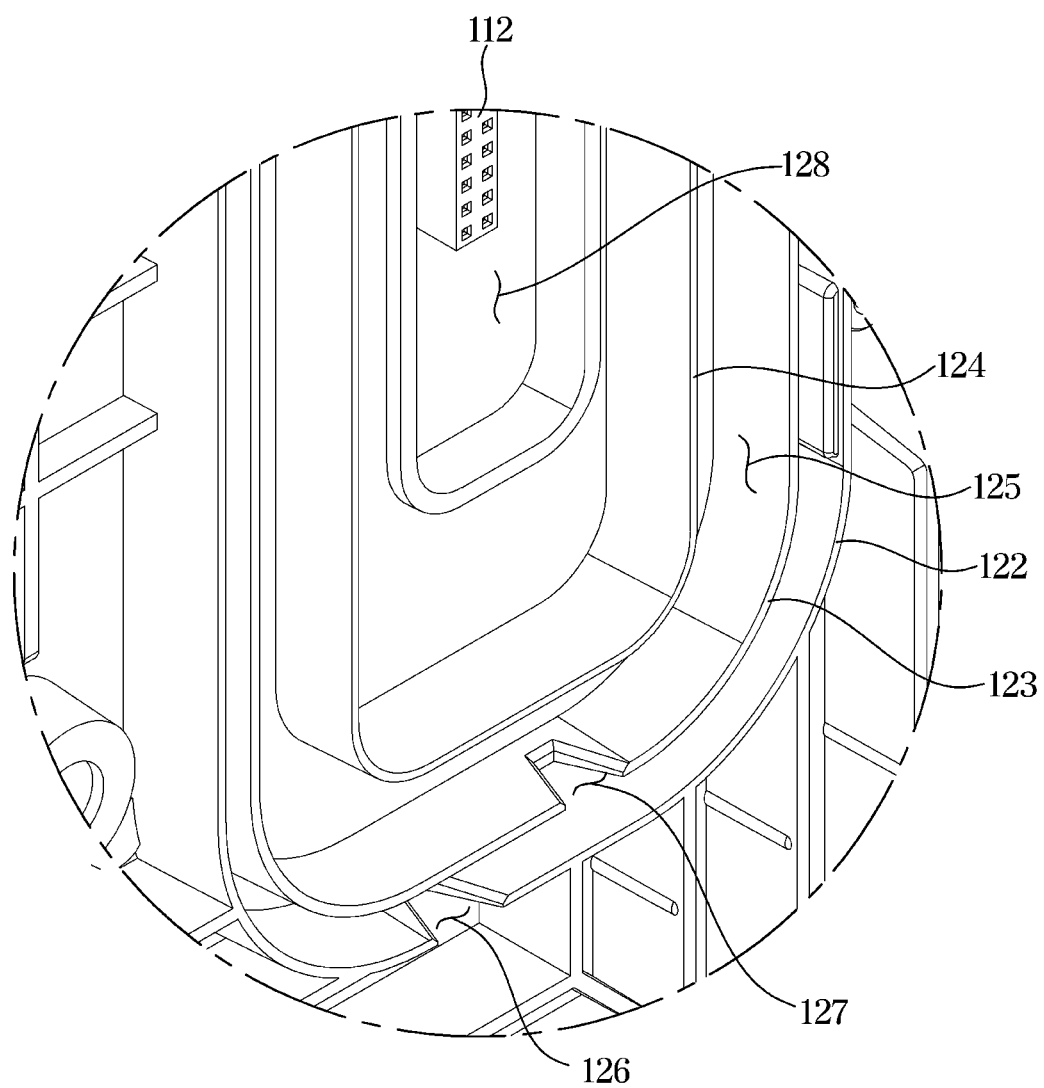
FIG. 10 illustrates an enlarged view of part E of FIG. 7.
Figure 11:
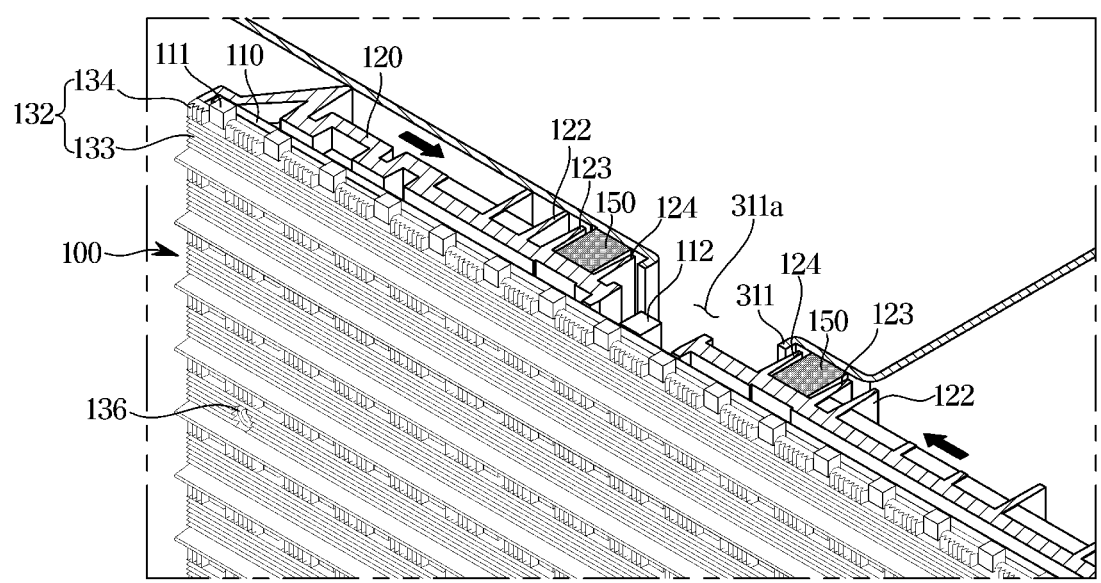
FIG. 11 illustrates a cross-sectional perspective view taken along line B-B' of FIG. 4.

FIG. 10 is an enlarged view of part E of FIG. 7. FIG. 11 is a cross-sectional perspective view taken along line B-B' of FIG. 4.

Referring to FIG. 10, the display module 100 may include a first drain hole 126 provided at a lower end of the first waterproof rib 122 and a second drain hole 127 provided at a lower end of the second waterproof rib 123.

In one embodiment, the first drain hole 126 may be formed by cutting a portion of the first waterproof rib 122, and the second drain hole 127 may be formed by cutting a portion of the second waterproof rib 123. In another embodiment, the first drain hole 126 may be formed to pass through a portion of the first waterproof rib 122, and similarly, the second drain hole 127 may also be formed to pass through a portion of the second waterproof rib 123.

The first drain hole 126 may be provided at the lower end of the first waterproof rib 122, and the second drain hole 127 may be provided at the lower end of the second waterproof rib 123.

The first drain hole 126 may be spaced apart from the second drain hole 127 in the upper-to-lower direction and also in the left-to-right direction. The first drain hole 126 and the second drain hole 127 may be spaced apart from each other in the upper-to-lower direction and also in the left-to-right direction to reduce the amount of water passing from a lower side of the first waterproof rib 122 to the first drain hole 126 and to the second drain hole 127. The first drain hole 126 and the second drain hole 127 may be spaced apart in the left-to-right direction so as not to overlap in the upper-to-lower direction. In other words, the first drain hole 126 may not be located below the second drain hole 127. Such structure is to prevent moisture from reaching the first connector 112 by passing through the first drain hole 126 and the second drain hole 127. When the first drain hole 126 and the second drain hole 127 overlap each other in the upper-to-lower direction, a water inflow path from a lower side of the first drain hole 126 to the first drain hole 126 and the second drain hole 127, and then, to the sealing groove 125 may be simplified, which may increase the possibility of water inflow into the sealing groove 125.

When the first drain hole 126 and the second drain hole 127 are spaced apart in the left-to-right direction, water introduced through the first drain hole 126 may pass through the second drain hole 127 only by moving laterally and then upwardly, and thus, the water inflow path to the sealing groove 125 via the first drain hole 126 and the second drain hole 127 becomes complicated, which may reduce the possibility of water being introduced into the sealing groove 125. Although the sealing member 150 is provided to block moisture from being introduced to the inside of the sealing groove 125 and the third waterproof rib 124, it is appropriate to reduce the amount of moisture inflow into the sealing member 150 in order to enhance the waterproof performance of the display module 100. Accordingly, the first drain hole 126 and the second drain hole 127 may be disposed spaced apart from each other in the left-to-right direction and also in the upper-to-lower direction.

Referring to FIG. 11, a water inflow blocking structure of the display module 100 that is coupled to the cabinet 200 will be described in detail.

While the display module 100 is coupled to the cabinet 200, the sealing member 150 may be in contact with the front surface of the first case 310. The sealing member 150 may be in contact with the front surface of the first case 310 and the rear surface of the holder 120 to seal a region between the front surface of the first case 310 and the rear surface of the holder 120. While the display module 100 is coupled to the cabinet 200, the sealing member 150 may block the inflow of water from outside of the sealing member 150 to inside of the sealing member 150.

The display apparatus 1 may include the first waterproof rib 122, the second waterproof rib 123, the third waterproof rib 124, the sealing member 150, and the rib 311 to block water from being introduced to a region inside of the display module 100 in which the first connector 112 is located while blocking water from being introduced to a region inside the circuit case 300 in which the second connector 301 is located.

The display module 100 may block water from being introduced through the opening formed inside of the third waterproof rib 124, thereby blocking water from being introduced to a region inside of the display module 100. In other words, the display module 100 may be provided to block moisture from being introduced there into from other region than the opening through which the first connector 112 is exposed to the outside. The circuit case 300 may block water from being introduced through the second connector hole 311a, thereby blocking water from being introduced to a region inside the circuit case 300. In other words, the circuit case 300 may be provided to block moisture from being introduced there into from other region than the second connector hole 311a through which the second connector 301 is exposed to the outside. Therefore, by sealing the opening inside of the third waterproof rib 124 of the display module 100 and sealing the second connector hole 311a of the circuit case 300, the water inflow to the inside of the display apparatus 1 may be blocked.

As water is introduced to the inside of the display apparatus 1 in which the first connector 112 and the second connector 301 are located, as indicated by the arrow in FIG. 10, water from the outside of the first waterproof rib 122 needs to pass through the first waterproof rib 122, the second waterproof rib 123, the sealing member 150, the third waterproof rib 124, and the rib 311. That is, since the first waterproof rib 122, the second waterproof rib 123, the sealing member 150, the third waterproof rib 124, and the rib 311 are provided on the water inflow path, it is difficult for water to flow to the inside of the display apparatus 1 by passing through the structures, and through this, the waterproof performance of the display apparatus 1 may be improved.

In addition, the display apparatus 1 may block water from being introduced to a region inside of the display module 100 and a region inside of the circuit case 300 by sealing only a portion of the rear surface of the display module 100 and a portion of the front surface of the circuit case 300.

As described above, the display module 100 may be waterproofed by blocking water from being introduced through the opening formed inside of the third waterproof rib 124. The circuit case 300 may be provided to be waterproofed by blocking water from being introduced through the second connector hole 311a. Therefore, by sealing only a partial area of the rear surface of the display module 100 and a partial area of the front surface of the circuit case 300 corresponding thereto, the display apparatus 1 may be waterproofed.

The partial area may refer to a region inside of the sealing member 150. Through the first waterproof rib 122, the second waterproof rib 123, and the third waterproof rib 124, the sealing member 150, and the rib 311, water may be blocked from being introduced to a region inside of the sealing member 150, and since the region inside of the sealing member 150 has a relatively small area and thus inflow of moisture may be effectively blocked. That is, the waterproof performance may be improved by reducing the area requiring waterproofing. In addition, by reducing the area requiring waterproofing, the risk of water inflow into the region requiring waterproofing may be reduced.

Although the disclosure has been shown and described in relation to specific embodiments, it would be appreciated by those skilled in the art that changes and modifications may be made in these embodiments without departing from the principles and scope of the disclosure, the scope of which is defined in the claims and their equivalents.

What is claimed is:

1. A display apparatus comprising:
   a display module comprising:
      a substrate on which a plurality of light emitting diodes (LEDs) are mounted,
      a holder covering a rear side of the substrate,
      a reinforcement member provided on a rear side of the holder, and
      a fixing member protruding rearward from the holder;
   a cabinet provided to support the display module and comprising a plurality of first magnets and a through hole through which the fixing member passes; and
   a circuit case comprising a plurality of second magnets and coupled to the cabinet,
   wherein the display module is coupled to the cabinet by a first magnetic attraction between the plurality of first magnets and the reinforcement member and a second magnetic attraction between the plurality of second magnets and the reinforcement member.

2. The display apparatus of claim 1, wherein the fixing member is configured to be rotatable between a disengagement position in which the fixing member passes through the through hole and an engagement position in which the fixing member is prevented from passing through the through hole.

3. The display apparatus of claim 2, wherein the fixing member is further configured to, the fixing member being positioned in the engagement position, prevent the display module from being separated from the cabinet, and, the fixing member being positioned in the disengagement position, allow the display module to be separated from the cabinet.

4. The display apparatus of claim 2, wherein one end of the fixing member is exposed on a front side of the display module such that the fixing member is rotatable at a front of the display module, and
   another end of the fixing member is exposed on a rear side of the display module such that the fixing member is rotatable at a rear of the display module.

5. The display apparatus of claim 1, wherein the display module further comprises a ground gasket mounted on the substrate to be in contact with a ground pad of the substrate, and
   at least a portion of the ground gasket is provided to be in contact with the reinforcement member through a ground hole formed in the holder.

6. The display apparatus of claim 5, wherein the display module further comprises a ground sealing member provided between the holder and the reinforcement member, and
   wherein the ground sealing member extends along a periphery of the ground hole.

7. The display apparatus of claim 1, wherein the display module further comprises a first connector exposed on a rear side of the display module through a first connector hole formed in the holder, and
   the circuit case further comprises a second connector exposed on a front side of the circuit case through a second connector hole formed in the circuit case, and the second connector being coupled to the first connector.

8. The display apparatus of claim 7, wherein the holder further comprises:
   a first waterproof rib provided to surround the first connector hole; and
   a second waterproof rib provided inside of the first waterproof rib to surround the first connector hole.

9. The display apparatus of claim 8, wherein the first waterproof rib comprises a first drain hole provided at a lower end of the first waterproof rib, and wherein the second waterproof rib comprises a second drain hole provided at a lower end of the second waterproof rib.

10. The display apparatus of claim 9, wherein the second drain hole are arranged to be spaced apart from the first drain hole in an upper-to-lower direction and in a left-to-right direction.

11. The display apparatus of claim 8, wherein the display module further comprises a sealing member provided inside of the second waterproof rib, wherein the sealing member is configured to seal a region between the second waterproof rib and the first connector hole, wherein the sealing member is coupled to the holder or the circuit case.

12. The display apparatus of claim 11, wherein the holder further comprises:

a third waterproof rib provided inside of the second waterproof rib to surround the first connector hole; and a sealing groove formed between the second waterproof rib and the third waterproof rib, wherein the sealing member is inserted into the sealing groove.

13. The display apparatus of claim 7, wherein the holder is configured to block water from being introduced to a region inside the holder from a region of the holder other than the first connector hole.

14. The display apparatus of claim 1, wherein the display module comprises a plurality of display modules, and wherein the cabinet is provided to support the plurality of display modules.

15. The display apparatus of claim 14, wherein the cabinet comprises a plurality of cabinets, and wherein the plurality of cabinets are provided to be coupled to each other in a horizontal direction and a vertical direction.

16. A display apparatus comprising:

a display module comprising a reinforcement member, a first waterproof rib, and a second waterproof rib; and a cabinet comprising a plurality of magnets, wherein the plurality of magnets of the cabinet is magnetically coupled with the reinforcement member of the display module, wherein a first drain hole is provided at a lower end of the first waterproof rib, and wherein a second drain hole is provided at a lower end of the second waterproof rib.

17. The display apparatus of claim 16, wherein the second drain hole are arranged to be spaced apart from the first drain hole in an upper-to-lower direction and in a left-to-right direction.

18. The display apparatus of claim 16, wherein the display module further comprises a sealing member provided inside of the second waterproof rib, wherein the sealing member is configured to seal a region between the second waterproof rib and the first connector hole.

* * * * *